United States Patent
Hsu et al.

(10) Patent No.: US 7,546,682 B2
(45) Date of Patent: Jun. 16, 2009

(54) METHODS FOR REPAIRING CIRCUIT BOARD HAVING DEFECTIVE PRE-SOLDERING BUMP

(75) Inventors: Shih-Ping Hsu, Hsin-chu (TW); Chao Wen Shih, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 0 days.

(21) Appl. No.: 11/603,813

(22) Filed: Nov. 21, 2006

(65) Prior Publication Data

US 2007/0278673 A1    Dec. 6, 2007

(30) Foreign Application Priority Data

Jun. 6, 2006    (TW) .............................. 95119963 A

(51) Int. Cl.
*H05K 3/34*    (2006.01)
(52) U.S. Cl. .............................. 29/840; 29/839; 29/843; 228/102; 228/180.1; 174/262
(58) Field of Classification Search ........... 29/575–578, 29/830–831, 840, 764, 839; 174/255, 260–264; 228/119, 264, 20.1, 21; 438/680, 662, 798
See application file for complete search history.

(56) References Cited

U.S. PATENT DOCUMENTS

| | | | | |
|---|---|---|---|---|
| 4,630,355 A | * | 12/1986 | Johnson .......................... | 438/6 |
| 4,929,845 A | * | 5/1990 | Amir et al. ............. | 250/559.05 |
| 6,211,080 B1 | * | 4/2001 | Tatah .......................... | 438/680 |
| 6,216,938 B1 | * | 4/2001 | Card et al. .................. | 228/20.1 |
| 6,349,871 B1 | * | 2/2002 | Card et al. .................. | 228/119 |
| 6,845,556 B1 | * | 1/2005 | Liang .......................... | 29/840 |

* cited by examiner

*Primary Examiner*—Minh Trinh
(74) *Attorney, Agent, or Firm*—Sawyer Law Group, P.C.

(57) ABSTRACT

A method for repairing a circuit board having defective pre-soldering bumps is proposed. Firstly, the circuit board having a plurality of pre-soldering bumps on a surface thereof is provided, wherein at least one of the pre-soldering bumps has a defect. Then, a micro-electroplating process or a micro-electrolyzing process is performed by a micro-electrode nearby the defective pre-soldering bump, so as to repair the defective pre-soldering bump. Therefore, the present invention is able to enhance the process yield and reduce the production cost.

9 Claims, 4 Drawing Sheets

METHODS FOR REPAIRING CIRCUIT BOARD HAVING DEFECTIVE PRE-SOLDERING BUMP

CROSS-REFERENCE TO RELATED APPLICATIONS

Under 35 U.S.C. 119(e), this application claims priority to Taiwanese Patent Application No. 095119963, filed Jun. 6, 2006, and is related to co-pending U.S. patent application Ser. No. 11/544,406, filed Oct. 5, 2006, entitled "Method for Repairing Metal Finish Layer on Surface of Electrical Connection Pad of Circuit Board", and co-pending U.S. patent application Ser. No. 11/544,210, filed Oct. 5, 2006, entitled, "Repaired pre-soldering Structure of Circuit Board and Method Thereof", and co-pending U.S. patent application Ser. No. 11/544,211filed Oct. 5, 2006, entitled, "Circuit Board Structure and Dielectric Layer Structure thereof", all incorporated herein by reference.

BACKGROUND OF THE INVENTION

1. Field of the Invention

The present invention relates to a repaired structure of a circuit board having pre-soldering bumps and a method for repairing the same, and more particularly, to a method for repairing a defective pre-soldering bump by a micro-electrode.

2. Description of the Prior Art

With demand for increasing various portable electronic products, recent packaging techniques for integrated circuits is in line with the trend toward miniaturization and higher density. Thus, packaging techniques with highly integrated circuits such as a ball grid array (BGA) package, a flip chip package, a chip size package (CSP) and a multi-chip module (MCM) package have been developed as a consequence. Moreover, the so-called packaging density of the integrated circuits refers to the number of pins within a unit area. With regard to an integrated circuit package with a high density, as the length of wires becomes shorter, the speed of signal transmission can be improved. Therefore, the application of bumps has become a mainstream in the high-density packaging techniques.

In the exemplification of the flip chip package, electrode pads are formed on an active surface of a semiconductor chip and corresponding conductive pads are formed on a circuit board, such that the electrode pads formed on the active surface of the semiconductor chip can be electrically connected to the circuit board by the means of pre-soldering bumps or other conductive adhesive materials formed between the semiconductor chip and the circuit board, wherein the pre-soldering bumps or the conductive adhesive material allows the semiconductor chip to electrically and mechanically connect to the circuit board.

During the fabrication of pre-soldering bumps, however, defects of pre-soldering bumps may exist due to some unavoidable reasons such as operating conditions, equipment or other process factors. The common defects of pre-soldering bumps include bumps which have no, insufficient or excessive soldering materials. Besides, an oversized or undersized bump will cause inconsistent heights of the bumps, such that the attachment and electrical performance between the semiconductor chip and circuit board will be adversely affected in subsequent packaging processes. Furthermore, with the trend of the continuous miniaturization of semiconductor components and the continuous improvement of circuit integration, a tinny little defect during the packaging process will still seriously ruin the quality of electrical devices.

Referring to the prior art, if a defective bump is detected before a reflow-soldering process, the defective bump cannot be repaired. Instead, the defective bump has to be accepted or the whole circuit board needs to be reworked. If a defective bump is detected after the reflow-soldering process, the whole circuit board needs to be scrapped as there is no remedy. Thus, the prior art is not cost effective and results in a big waste of materials.

Accordingly, the problem to be solved herein is to provide a repaired structure of a circuit board having pre-soldering bumps and a method for repairing the same, by which a process yield can be improved and the production cost can be reduced.

SUMMARY OF THE INVENTION

In light of the above drawback of the prior art, a primary objective of the present invention is to provide a repaired structure of a circuit board having pre-soldering bumps and a method for repairing the same, so as to improve the process yield and reduce the production cost.

In accordance with the foregoing and other objectives, the present invention proposes a method for repairing a circuit board having pre-soldering bumps, comprising steps of: providing a circuit board having a plurality of conductive pads and a solder mask formed on a surface thereof, wherein the solder mask has a plurality of openings to expose the conductive pads, the surface of each of the conductive pads has a pre-soldering bump formed thereon, at least one of the pre-soldering bumps has a defect, and the circuit board further has an exposed wire or a conductive layer electrically connecting to the conductive pad having the defective pre-soldering bump formed thereon; providing a direct current power supply having a first electrode and an opposing second electrode, wherein the first electrode is applied to electrically contact the exposed wire or the conductive layer; providing an electrolyte having the anion of the pre-soldering bump material, and placing the circuit board into the electrolyte; and providing a micro-electrode nearby the defective pre-soldering bump to thereby repair the defect, wherein the micro-electrode electrically connects to the second electrode.

With regard to the foregoing method, the defect of the pre-soldering bumps refers to one of an incomplete pre-soldering bump and an omission where no pre-soldering bump is formed, and the micro-electrode along with the second electrode serves as an oxidizing end, while the exposed wire or the conductive layer along with the first electrode serves as a reducing end, thereby mending the defect through a micro-electroplating process of a reduction reaction.

In another embodiment of the present invention, the defect of the pre-soldering bumps refers to one of an oversized pre-soldering bump and a bridging part (a short circuit) formed between two of the pre-soldering bumps, and the micro-electrode along with the second electrode serves as a reducing end, while the exposed wire or the conductive layer along with the first electrode serves as an oxidizing end, thereby pruning the defect through a micro-electrolyzing process of an oxidation reaction.

The present invention also proposes a repaired structure of a circuit board having pre-soldering bumps, comprising: a circuit board having a plurality of conductive pads and a solder mask formed on a surface thereof, wherein the solder mask has a plurality of openings to expose the conductive pads, the surface of each of the conductive pads has a pre-soldering bump formed thereon, and at least one of the pre-soldering bumps has a defect of incompleteness; and at least one mending pre-soldering bump formed by micro-electroplating on the defective pre-soldering bump.

In comparison to the prior art, the present invention can mend an incomplete pre-soldering bump or an omission of no pre-soldering bump formed through a micro-electroplating process of a reduction reaction, and can prune an oversized pre-soldering bump or a bridging part between two pre-soldering bumps through a micro-electrolyzing process of an oxidation reaction by a micro-electrode. Therefore, the scrap rate of the circuit board can be reduced to thereby improve the process yield and decrease the production cost.

BRIEF DESCRIPTION OF THE DRAWINGS

The present invention can be more fully understood by reading the following detailed description of the preferred embodiments, referring to the accompanying drawings, wherein.

DETAILED DESCRIPTION OF THE EMBODIMENTS

The present invention is described in the following specific embodiments, so that one skilled in the pertinent art can easily understand other advantages and effects of the present invention from the disclosure.

What needs to be particularly concerned here is that the present invention is applicable to any stage of a circuit board fabrication where a pre-soldering bump has been formed. The defect of pre-soldering bumps such as no, insufficient, and excessive soldering materials, which can be found by operators, can all be repaired.

The First Embodiment

Figure 1A:
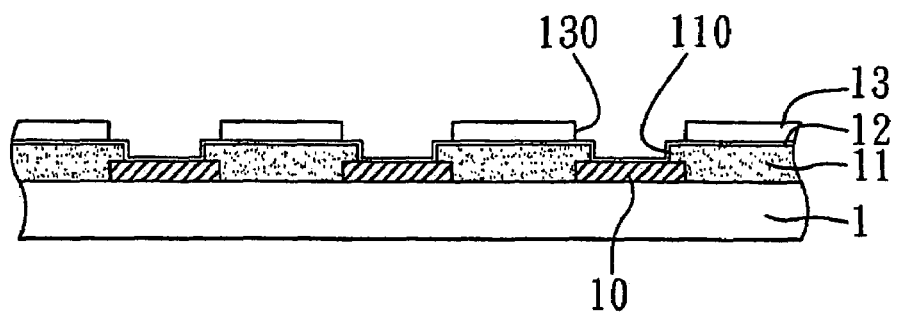
FIGS. 1A to 1C are cross-sectional views showing a method for repairing a circuit board having pre-soldering bumps according to the first embodiment of the present invention.
Figure 1B:
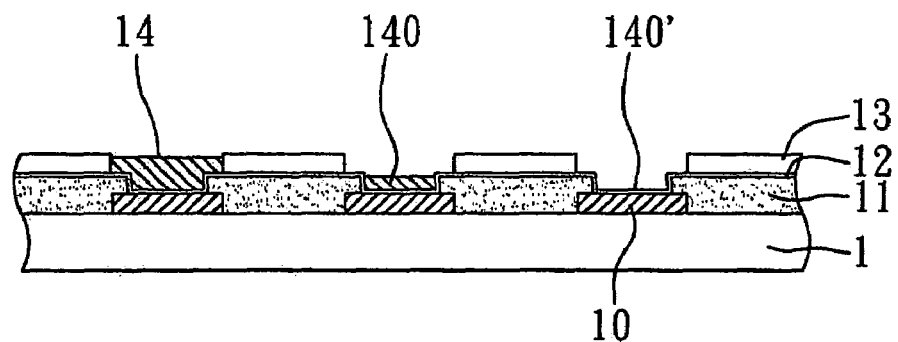
Figure 1C:
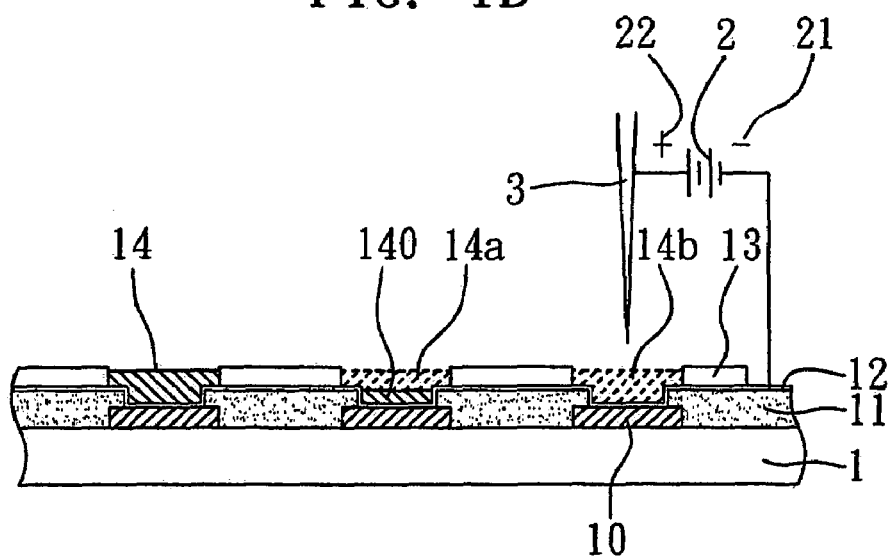

FIG. 1A to FIG. 1C are cross-sectional views showing a method for repairing a circuit board having pre-soldering bumps according to the first embodiment of the present invention.

Referring to FIG. 1A, firstly, a circuit board 1 whose earlier stage of circuit fabrication has been completed is provided. The circuit board 1 has a plurality of conductive pads 10 on at least a surface thereof, and a solder mask 11 is formed on the surface of the circuit board 11, wherein the solder mask 11 has a plurality of openings 110 to expose the conductive pads 10. Then, a conductive layer 12 is formed on the solder mask 11 and the exposed conductive pads 10. Further, a resistive layer 13 is formed on the conductive layer 12, and the resistive layer 13 has openings 130 formed therein to expose parts of the conductive layer 12.

Referring to FIG. 1B, a plurality of pre-soldering bumps 14, with a normal predetermined height each, are formed on the conductive pads 10 by an electroplating process through the conductive layer 12, wherein at least one of the pre-soldering bumps 14 has a defect of incompleteness 140 or an omission 140' where no pre-soldering bump is formed on one conductive pad 10.

Referring to FIG. 1C, a direct current power supply 2 having a first electrode 21 and an opposing second electrode 22 as well as an electrolyte having the anion of the pre-soldering bump material(not shown) is provided, and then the circuit board 1 is placed into the electrolyte, followed by providing a micro-electrode 3 electrically connecting to the second electrode 22 and serving as an oxidizing end whereas the conductive layer 12 electrically connecting to the conductive pad 10 serving as a reducing end in a micro-electroplating process, wherein the conductive layer 12 is applied to electrically contact the first electrode 21 so as to form a current loop for the micro-electroplating process. Thus, the micro-electroplating process can mend the defect of incompleteness 140 or the omission 140' by forming a mending pre-soldering bump 14a, 14b. Moreover, the pre-soldering bumps 14, 14a and 14b are selected from lead, tin, silver, copper, gold, bismuth, antimony, zinc, nickel, zirconium, magnesium, indium, tellurium, gallium, and an alloy of a combination of the above materials.

Subsequently, the resistive layer 13 and the underneath conductive layer 12 is removed(not shown), and then a reflow-soldering process can be performed at the melting point of the pre-soldering bumps 14 (not shown).

The Second Embodiment

Figure 2:
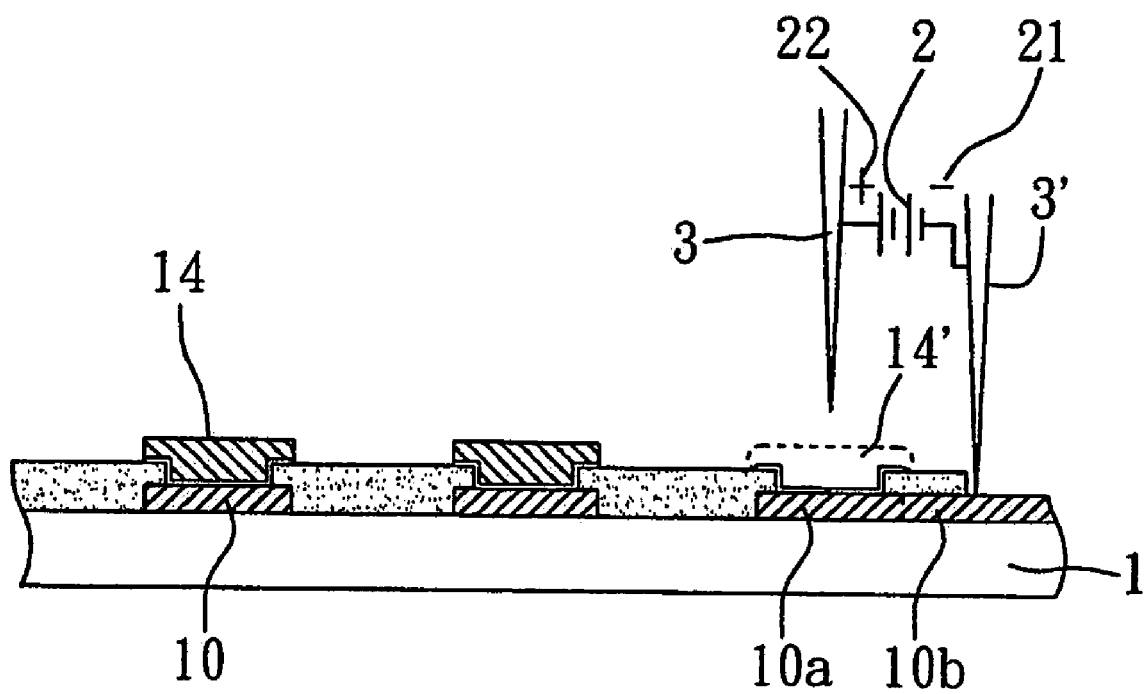
FIG. 2 is a cross-sectional view showing a method for repairing a circuit board having pre-soldering bumps according to the second embodiment of the present invention.

The present embodiment differs from the foregoing embodiment in that defective pre-soldering bumps are repaired by a micro-electrode after the removal of the conductive layer. As shown in FIG. 2, another micro-electrode 3' electrically connecting to the first electrode 21 is applied to electrically contact an exposed wire 10b electrically connecting to the conductive pad 10a where none of the pre-soldering bumps 14 or a pre-soldering bump of incompleteness(not shown) is formed. Thus, the conductive pad 10a serves as a reducing end, and the micro-electrode 3 nearby the conductive pad 10a serves as an oxidizing end in a micro-electroplating process, such that the micro-electroplating process is performed on the conductive pad 10a to form a mending pre-soldering bump 14'.

The Third Embodiment

Figure 3A:
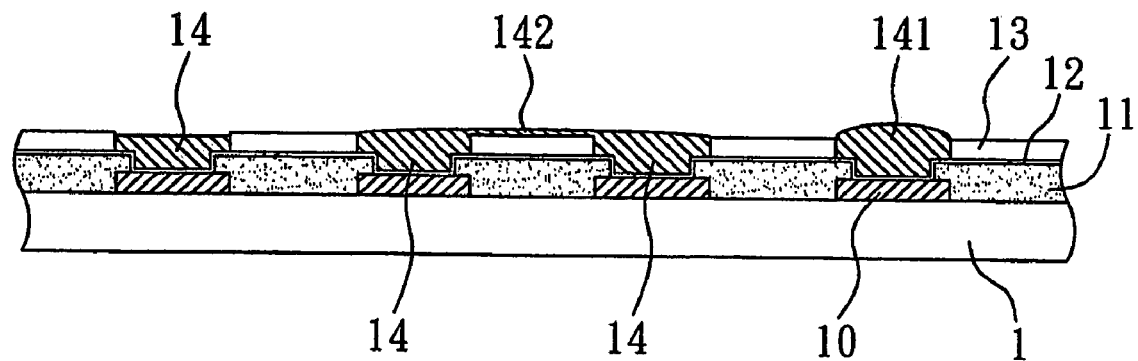
FIGS. 3A and 3B are cross-sectional views showing a method for repairing a circuit board having pre-soldering bumps according to the third embodiment of the present invention.
Figure 3B:
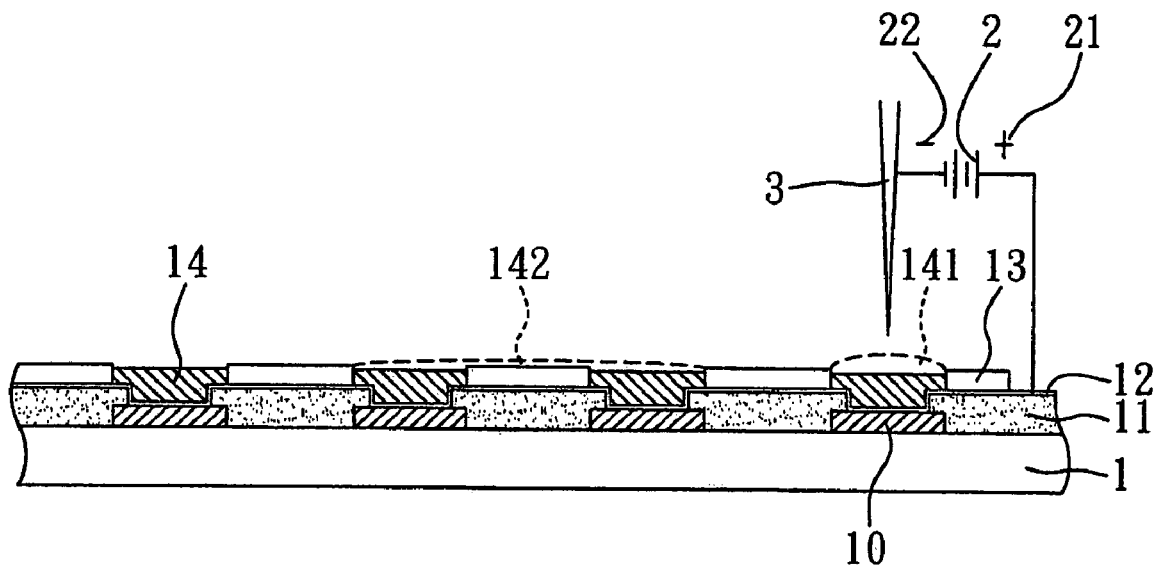

FIG. 3A and FIG. 3B are cross-sectional views showing a method for repairing a circuit board having pre-soldering bumps according to the third embodiment of the present invention. The present embodiment differs from the foregoing embodiment in that at least one of the pre-soldering bumps has a defect of oversized or one bridging part (a short circuit) formed between two pre-soldering bumps. The details of the method will be provided in the following description.

Referring to FIG. 3A, firstly, a circuit board 1 is provided. Defect-free pre-soldering bumps 14 and at least one of the pre-soldering bumps 14 having a defect of oversize 141 are formed on the conductive pads 10. Further, one bridging part 142 between two pre-soldering bumps 14 can also be formed. In other words, a short circuit between two of the pre-soldering bumps 14 is resulted from the bridging part 142.

Referring to FIG. 3B, a direct current power supply 2 having a first electrode 21 and an opposing second electrode 22 as well as an electrolyte having the anion of the pre-soldering bump material (not shown) is provided, and then the circuit board 1 is placed into the electrolyte, followed by providing a micro-electrode 3 electrically connecting to the second electrode 22 and serving as a reducing end whereas the conductive layer 12 electrically connecting to the conductive pads 10 and serving as an oxidizing end in a micro-electrolyzing process, wherein the conductive layer 12 is applied to electrically contact the first electrode 21 so as to form a current loop for the micro-electrolyzing process. Thus, the micro-electrolyzing process can prune the oversized pre-soldering bump 141 and remove the bridging part 142 to form pre-soldering bumps 14 with a normal size but no defect. Moreover, the pre-soldering bumps 14, 141 and the bridging part 142 are selected from lead, tin, silver, copper, gold, bismuth, antimony, zinc, nickel, zirconium, magnesium, indium, tellurium, gallium, and an alloy of a combination of the above materials.

Subsequently, the resistive layer 13 and the underneath conductive layer 12 is removed (not shown), and then a reflow-soldering process can be performed at the melting point of the pre-soldering bumps 14 (not shown).

The Fourth Embodiment

Figure 4:
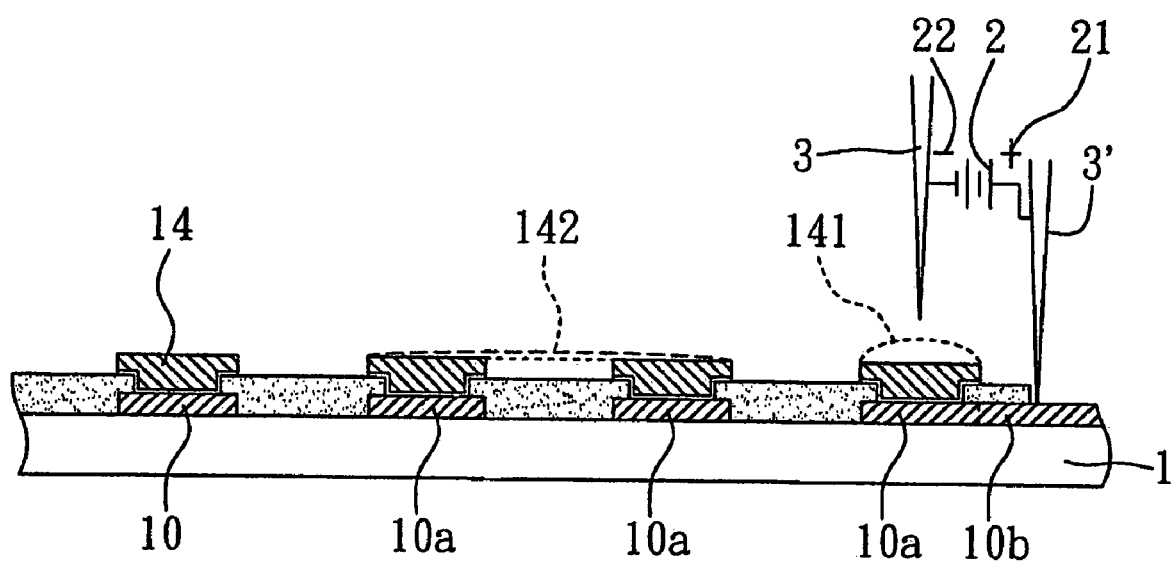
FIG. 4 is a cross-sectional view showing a method for repairing a circuit board having pre-soldering bumps according to the fourth embodiment of the present invention.

The present embodiment differs from the foregoing embodiment in that a defective pre-soldering bump is repaired by a micro-electrolyzing process after the removal of the conductive layer. As shown in FIG. 4, another micro-electrode 3' electrically connecting to the first electrode 21 is applied to electrically contact an exposed wire 10*b* electrically connecting to the conductive pad 10*a* which has an defective pre-soldering bump 141 of oversize formed thereon. Further, a bridging part 142 between two pre-soldering bumps 14 can also be formed. Then, the conductive pad 10*a* serves as an oxidizing end, and the micro-electrode 3 nearby the conductive pad 10*a* serves as a reducing end, such that the micro-electrolyzing process is performed on the conductive pad 10*a*. Thus, the micro-electrolyzing process can prune the oversized pre-soldering bump 141 and remove the bridging part 142 to form pre-soldering bumps 14 with a normal size but no defect.

In other embodiment of the present invention, if an omission where no pre-soldering bump is formed, an incomplete pre-soldering bump, an oversized pre-soldering bump and a bridging part formed between two pre-soldering bumps are simultaneously formed on the surface of the circuit board 1, a micro-electroplating process and a micro-electrolyzing process (or a micro-electrolyzing process and a micro-electroplating process) can be sequentially performed using a micro-electrode to mend or prune the defective pre-soldering bumps.

The present invention further proposes a repaired structure of a circuit board having pre-soldering bumps, as shown in FIG. 1C, comprising a circuit board 1 having a plurality of conductive pads 10 and a solder mask 11 formed on a surface thereof, wherein the solder mask 11 has a plurality of openings 110 to expose the conductive pads 10, the surface of each of the conductive pads 10 has a pre-soldering bump 14 formed thereon, and at least one of the pre-soldering bumps 14 has a defect of incompleteness 140; and at least a mending pre-soldering bump 14*a* formed by micro-electroplating on the defective pre-soldering bump 140.

In comparison to the prior art, the present invention is able to perform a micro-electroplating process or a micro-electrolyzing process on the surface of an undersized or oversized pre-soldering bump by a micro-electrode. Therefore, the method proposed in the present invention is able to effectively repair the defective pre-soldering bumps, so as to reduce the scrap rate of the circuit boards to improve the process yield and reduce the production cost.

It should be apparent to those skilled in the art that the above description is only illustrative of specific embodiments and examples of the present invention. The present invention should therefore cover various modifications and variations made to the herein-described structure and operations of the present invention, provided they fall within the scope of the present invention as defined in the following claims.

What is claimed is:

1. A method for repairing a circuit board having defective pre-soldering bumps, comprising the steps of:

providing the circuit board having a plurality of conductive pads and a solder mask formed on a surface thereof, wherein the solder mask has a plurality of openings to expose the conductive pads, the conductive pads have a plurality of pre-soldering bumps formed thereon, and wherein the pre-soldering bumps are made of a pre-soldering bump material and at least one of the pre-soldering bumps has a defect, and the circuit board further has an exposed wire electrically connecting to the conductive pad having the defective pre-soldering bump formed thereon;

providing a direct current power supply having a first electrode and an opposing second electrode, wherein the first electrode is electrically contacted the exposed wire;

providing an electrolyte having an anion of the pre-soldering bump material, and placing the circuit board into the electrolyte; and providing a micro-electrode nearby the defective pre-soldering bump to thereby repair the defect, wherein the micro-electrode electrically connects to the second electrode.

2. The method of claim 1, further comprising another micro-electrode electrically connecting to the first electrode and electrically contacted the exposed wire.

3. The method of claim 1, wherein the defect of the pre-soldering bumps refers to one of an incomplete pre-soldering bump and an omission where no pre-soldering bump is formed, and the micro-electrode along with the second electrode serves as an oxidizing end, while the exposed wire along with the first electrode serves as a reducing end, thereby mending the defect through a micro-electroplating process of a reduction reaction.

4. The method of claim 1, wherein the defect of the pre-soldering bumps refers to one of an oversized pre-soldering bump and a bridging part as a short circuit formed between two of the pre-soldering bumps, and the micro-electrode along with the second electrode serves as a reducing end, while the exposed wire along with the first electrode serves as an oxidizing end, thereby pruning the defect through a micro-electrolyzing process of an oxidation reaction.

5. The method of claim 1, wherein the pre-soldering bumps are selected from lead, tin, silver, copper, gold, bismuth, antimony, zinc, nickel, zirconium, magnesium, indium, tellurium, gallium, and an alloy of a combination of the above materials.

6. A method for repairing a circuit board having defective pre-soldering bumps, comprising the steps of:

providing the circuit board having a plurality of conductive pads and a solder mask formed on a surface thereof, wherein the solder mask has a plurality of openings to expose the conductive pads, the conductive pads have a plurality of pre-soldering bumps formed thereon, and wherein the pre-soldering bumps are made of a pre-soldering bump material and at least one of the pre-soldering bumps has a defect, and the circuit board further has a conductive layer electrically connecting to the conductive pad having the defective pre-soldering bump formed thereon;

providing a direct current power supply having a first electrode and an opposing second electrode, wherein the first electrode is electrically contacted the conductive layer;

providing an electrolyte having an anion of the pre-soldering bump material, and placing the circuit board into the electrolyte; and providing a micro-electrode nearby the defective pre-soldering bump to thereby repair the defect, wherein the micro-electrode electrically connects to the second electrode.

7. The method of claim 6, wherein the defect of the pre-soldering bumps refers to one of an incomplete pre-soldering bump and an omission where no pre-soldering bump is formed, and the micro-electrode along with the second electrode serves as an oxidizing end, while the conductive layer along with the first electrode serves as a reducing end, thereby mending the defect through a micro-electroplating process of a reduction reaction.

8. The method of claim 6, wherein the defect of the pre-soldering bumps refers to one of an oversized pre-soldering bump and a bridging part as a short circuit formed between two of the pre-soldering bumps, and the micro-electrode along with the second electrode serves as a reducing end, while the conductive layer along with the first electrode serves as an oxidizing end, thereby pruning the defect through a micro-electrolyzing process of an oxidation reaction.

9. The method of claim 6, wherein the pre-soldering bumps are selected from lead, tin, silver, copper, gold, bismuth, antimony, zinc, nickel, zirconium, magnesium, indium, tellurium, gallium, and an alloy of a combination of the above materials.

* * * * *